United States Patent [19]

Mesch

[11] 3,833,426

[45] Sept. 3, 1974

[54] SOLAR ARRAY

[75] Inventor: Hans G. Mesch, Manhattan Beach, Calif.

[73] Assignee: TRW Inc., Redondo Beach, Calif.

[22] Filed: Nov. 8, 1973

[21] Appl. No.: 414,017

[52] U.S. Cl. .................................. 136/89, 29/572
[51] Int. Cl. .......................................... H01l 15/02
[58] Field of Search ......................... 136/89; 29/572

[56] References Cited

UNITED STATES PATENTS

| | | | |
|---|---|---|---|
| 3,094,439 | 6/1963 | Mann et al. | 136/89 |
| 3,232,795 | 2/1966 | Gillette et al. | 136/89 |
| 3,330,700 | 7/1967 | Galub et al. | 136/89 |
| 3,376,164 | 4/1968 | Bachwansky | 136/89 |
| 3,446,676 | 5/1969 | Webb | 136/89 |
| 3,466,198 | 9/1969 | Webb | 136/89 |

*Primary Examiner*—A. B. Curtis
*Attorney, Agent, or Firm*—Daniel T. Anderson, Donald R. Nyhagen, Jerry A. Dinaudo

[57] ABSTRACT

A solar array having solar cells arranged in parallel strings at the front side of a supporting substrate with the corresponding cells in the several strings arranged in rows transverse to the strings. Each cell has a rear contact surface facing and exposed through an opening in the substrate and front contact and light sensitive surfaces. The cells in each cell string are connected in electrical series by series interconnectors, each passing between a pair of adjacent cells and through the substrate. Each interconnector is electrically joined at its front end to the front contact surface of the adjacent cell and at its rear end to the rear contact surface of the other adjacent cell through the corresponding substrate opening. The cells in each cell row are connected in electrical parallel by parallel interconnector strips electrically jointed to the rear ends of the corresponding series interconnectors.

10 Claims, 3 Drawing Figures

SOLAR ARRAY

BACKGROUND OF THE INVENTION

1. Field of the Invention

This invention relates generally to the field of solar power generation and more particularly to a new and improved solar array.

2. Prior Art

Generally speaking, a solar array comprises a support, such as a substrate, mounting a multiplicity of solar cells. These cells are arrayed in a plurality of parallel strings with the corresponding cells of the several strings aligned in rows transverse to the strings. The cells in each cell string are connected in electrical series by series interconnectors. The cells in each cell row are connected in electrical parallel by parallel interconnectors.

The prior art relating to solar arrays is replete with a wide assortment of cell mounting arrangements and cell interconnectors. Examples of the prior art solar arrays are described in the following patents:

| | |
|---|---|
| 2,900,580 | Webb |
| 2,989,575 | Wallace |
| 3,005,862 | Escoffery |
| 3,200,468 | Mann |
| 3,232,795 | Gillette, et al. |
| 3,378,407 | Keys |
| 3,443,254 | Webb |
| 3,444,619 | Webb |
| 3,450,568 | Mann |
| 3,493,437 | Webb |
| 3,494,022 | Webb |
| 3,501,832 | Mann |
| 3,502,507 | Mann |
| Re 25,647 | Mann, et al. |

SUMMARY OF THE INVENTION

The improved solar array of this invention has a multiplicity of solar cells mounted on the front side of a supporting substrate, which may be a thin film flexible substrate or a rigid substrate. Each cell has a rear contact surface facing and exposed through an opening in the substrate and front contact and light sensitive surfaces.

The solar cells are arranged, in the usual way, in parallel strings with the corresponding cells of the strings aligned in rows transverse to the strings. The several cells in each cell string are connected in electrical series by series interconnectors. Each series interconnector passes between a pair of adjacent series cells and through the substrate and has a front end electrically joined to the front contact surface of one cell and a rear end joined to the rear contact surface of the other cell through the corresponding substrate opening.

According to a preferred feature of the invention, these series interconnectors also provide the sole attachment of the solar cells to the substrate.

The cells in each cell row are connected in electrical parallel by a parallel interconnector. This parallel interconnector is located at the rear side of the substrate and electrically joins the rear ends of the series interconnectors which connect the rear contact surfaces of the cells in the respective row to the front contact surfaces of the adjacent cells in the cell strings.

In the particular solar array described, the substrate is a thin flexible film of Mylar or the like. Each series cell interconnector has a generally Z shape and includes a central portion which passes between adjacent cells in a cell string and through the substrate, a front transverse end which overlaps and is electrically joined to the front contact surface of one adjacent cell, and a rear transverse end which extends across the rear side of the substrate into overlapping relation with and is electrically joined to the rear contact surface of the other adjacent cell through the corresponding substrate opening. Each parallel interconnector is a metallic clad strip on the rear side of the substrate and extending under and electrically joined to the rear ends of the corresponding series interconnectors.

DESCRIPTION OF THE PREFERRED EMBODIMENTS

Figure 1:
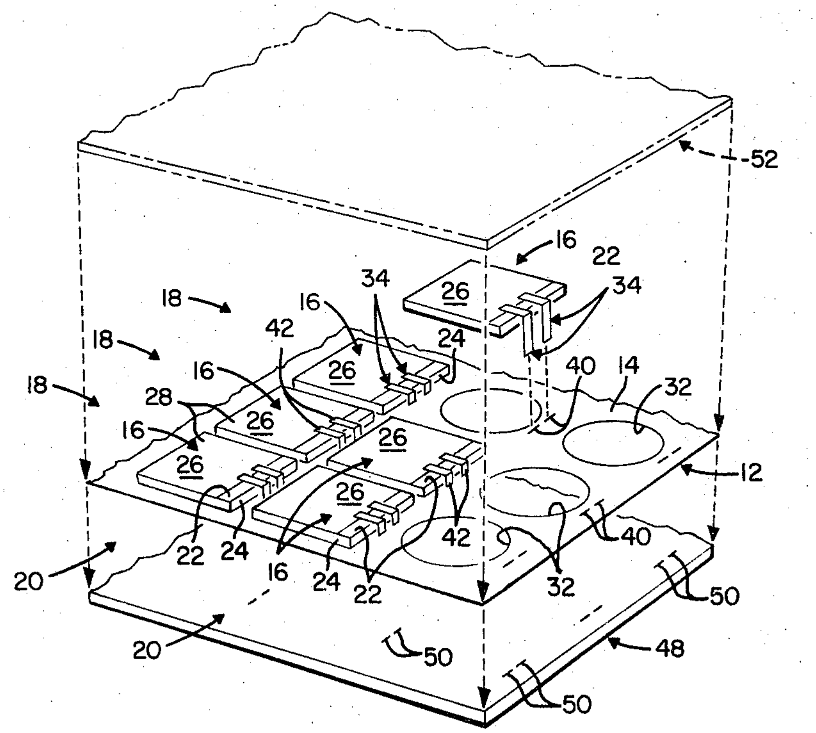
FIG. 1 illustrates an initial step in the fabrication of solar array according to the invention.

The solar array 10 of the invention has a substrate 12 which, in this instance, is a thin flexible film of Mylar or the like. Mounted on the front side 14 of this substrate are a multiplicity of solar cells 16. Cells 16 are arrayed in the usual fashion in parallel series strings 18 with the corresponding cells in the several strings aligned in rows 20 transverse to the strings.

The solar cells 16 are conventional solar cells each having an electrically conductive front contact surface 22 in the form of a narrow metal clad strip along one cell edge 24, a front light sensitive surface 26 extending from this contact surface to the opposite cell edge 28, and an electrically conductive rear contact surface 30 in the form of metal clad layer on the rear side of the cell. Cells 16 are located at the front side 14 of the substrate 12 with the rear contact surface 30 of each cell facing the substrate. The substrate contains circular openings 32 which expose or uncover the rear contact surfaces of the cells.

The solar cells 16 in each cell string 18 are connected in electrical series by series interconnectors 34. Each series interconnector extends between a pair of adjacent series cells and through the substrate 12 and is electrically joined to the front contact surface 22 of one cell and to the rear contact surface 30 of the other cell through the corresponding substrate opening 32. As will appear from the following description, these series interconnectors may provide the sole physical attachment of the cells to the substrate. The solar cells 16 in each cell row 20 are connected in electrical parallel by parallel interconnectors 36. Each parallel interconnector is located at the rear side of the substrate 12 and electrically joins the rear ends of the series interconnectors 34 which connect the rear contact surfaces of the cells in the respective cell row 20 to the front contact surfaces 22 of the adjacent cells in the cell strings 18.

The particular series interconnectors 34 shown comprise flexible metal strips bent into a generally Z shape. Each interconnector 34 has a central portion 38 which passes between a pair of adjacent solar cells 16 in the respective cell string 18 and through a slit 40 in the substrate 12, a front transverse end 42 which overlaps and is electrically joined to the front contact surface 22 of one adjacent cell, and a rear transverse end 44 which extends across the rear side of the substrate into overlapping relation with and is electrically joined to the rear contact surface 30 of the other adjacent cell through the corresponding substrate opening 32. Each pair of adjacent cells are joined by two series interconnectors. The illustrated parallel interconnectors 36 comprises metallic clad strips on the rear side of the substrate 12 and electrically joined to the rear ends 44 of the corresponding series interconnectors 34.

Figure 2:
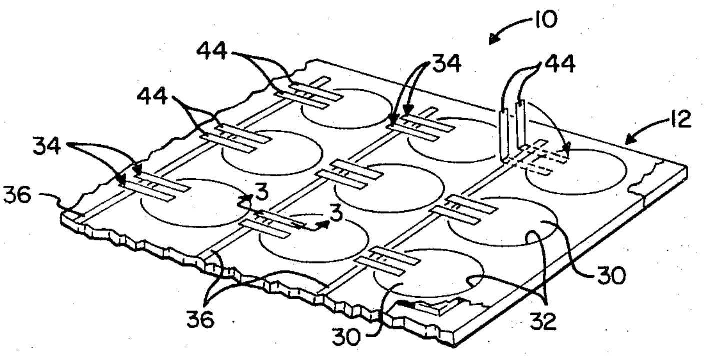
FIG. 2 illustrates a final step in the solar array fabrication.
Figure 3:
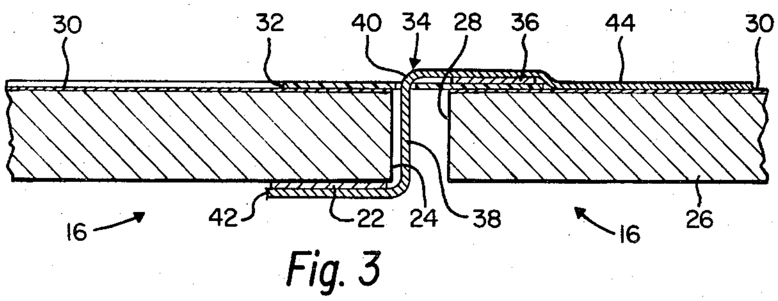
FIG. 3 is an enlarged section taken in line 3—3 in FIG. 2.

FIGS. 1 and 2 illustrate the preferred method of fabricating the solar array 10. According to this method, the substrate 12 is provided with the openings 32, slits 40, and rear interconnector clad strips 36. These clad strips may be deposited on the rear side of the substrate in any convenient way. The prepared substrate is then placed front side up on a rigid supporting plate 48 containing slits 50 arranged to register with the substrate slits 40. The metal strips of the series interconnectors 34 are initially bent to their L-shape of FIG. 1 to form the front transverse ends 42 of the inerconnectors. A pair of these partially formed interconnectors are joined to each solar cell 16 by placing the interconnector ends 42 over and brazing these ends to the front contact surface 22 of the cell. The opposite ends of the interconnectors then extend rearwardly toward and beyond the rear contact surface 30 of the cell, as shown.

The solar cells 16, with their attached, partially formed interconnectors 34, are placed, front side up, on the plate supported substrate 12 by inserting the rearwardly projecting ends of the interconnectors through the appropriate substrate slits 40 into the aligned slits 50 in the substrate supporting plate 48, as depicted in FIG. 1. At this stage in the fabrication, then, the substrate 12 rests on the supporting plate 48, and the solar cells 16 rest on the substrate with their rear contact surfaces 30 seating on the substrate and their rearwardly projecting interconnector ends extending downwardly through the substrate and plate slits 40, 50.

At this point, a second rigid plate 52 is placed on top of the substrate 12 and solar cells 16, and the entire assembly, consisting of the two plates 48, 52, the substrate 12 and solar cells 16, is inverted, after which the plate 48, which is now on top, is removed. Removal of plate 48 exposes the rear ends 44 of the series interconnectors 34 which then stand upright in the manner shown in the upper righthand corner of FIG. 2. In the final step of the fabrication, these upstanding interconnector ends are bent horizontally over and brazed to the parallel interconnector strips 46 and to the rear cell contact surfaces 30 which are exposed through the substrate openings 32.

If desired, the solar cells 16 may be adhesively bonded to the substrate 12 about the substrate openings 32. Preferably, however, the cells are affixed to the substrate solely by the series interconnectors 34. The series interconnectors, being resilient, permit flexing of the substrate.

I claim:

1. In a solar array, the combination comprising:
a supporting substrate having front and rear sides;
first and second solar cells at the front side of said substrate having rear sides facing the substrate and opposite front sides;
each cell having at its rear side an electrically conductive rear contact surface and at its front side an electrically conductive front contact surface and a light sensitive surface;
said substrate having openings exposing said rear cell contact surfaces; and
a cell interconnector passing through said substrate between said cells and electrically joined to said front contact surface of said first cell and to said rear contact surface of said second cell through the corresponding substrate opening for connecting said cells in electrical series.

2. The combination according to claim 1 wherein:
said front contact surface of each cell is located along one cell edge;
said cells are disposed in coplanar relation with a narrow space between the cells bounded by said one edge of said first cell and the opposite edge of the second cell; and
said interconnector has a generally Z-shape and includes a central portion extending through said space and the substrate, a transverse front end overlapping and electrically joined to said front contact surface of said first cell, and a transverse rear end extending across said rear side of said substrate into overlapping relation with and electrically joined to the rear contact surface of said second cell through the corresponding substrate opening.

3. The combination according to claim 2 wherein:
said interconnectors provide the sole attachment of said cells to said substrate.

4. The combination according to claim 3 wherein:
said substrate and interconnectors are flexible.

5. In a solar array, the combination comprising:
a supporting substrate having front and rear sides;
at least two parallel strings of solar cells arranged side by side at the front side of said substrate each including at least first and second cells having rear sides facing the substrate and opposite front sides;
each cell having at its rear side an electrically conductive rear contact surface and at its front side an electrically conductive front contact surface and a light sensitive surface;
said substrate having openings exposing said rear cell contact surfaces;
electrically conductive cell interconnectors connecting the cells of each cell string in electrical series;
each interconnector passing through said substrate between and adjacent cells in the respective string and being electrically joined to said front contact surface of said one cell and to said rear contact surface of the other cell through the corresponding substrate opening; and
electrically conductive cell interconnectors connecting the corresponding cells of said cell strings in electrical parallel.

6. The combination according to claim 5 wherein:
said front contact surface of each cell is located along one cell edge;
said cells of each cell string are disposed in coplanar relation with a narrow space between adjacent cells bounded by said one edge of one cell and the opposite edge of the other cell;
each series interconnector has a generally Z-shape and includes a central portion extending through said space between the corresponding cells and through said substrate, a transverse front end overlapping and electrically joined to the front contact surface of one cell, and a transverse rear end extending across the rear side of said substrate into overlapping relation with and electrically joined to the rear contact surface of the other cell through the respective substrate opening; and said parallel cell interconnectors comprise electrically conductive strips on the rear substrate side along said cell rows and electrically joined to the rear ends of the corresponding series interconnectors.

7. The combination according to claim 6 wherein:

said series interconnectors provide the sole attachment of said solar cells to said substrate.

8. A solar array comprising:

a supporting substrate having front and rear sides;

parallel strings of solar cells arranged side by side at the front side of said substrate, said cells having rear sides facing said substrate and opposite front sides;

each cell having at its rear side an electrically conductive rear contact surface and at its front side and electrically conductive front contact surface along one cell edge and a light sensitive surface between said front contact surface and the opposite cell edge;

said substrate having openings exposing said rear contact surfaces;

the cells in each cell string being arranged with a space between adjacent cells bounded by said one edge of one adjacent cell and said opposite edge of the other adjacent cell, and the corresponding cells of the several strings being arranged in rows normal to said strings;

electrically conductive series interconnectors electrically connecting the cells of each cell string in electrical series, each cell interconnector having a generally Z-shape and including a central portion extending through the space between a pair of adjacent cells and through said substrate, a transverse front end overlapping and electrically joined to the front contact surface of one adjacent cell, and a transverse rear end extending across said rear side of said substrate into overlapping relation with and electrically joined to said rear contact surface of the other adjacent cell through the corresponding substrate opening; and electrically conductive parallel interconnectors electrically connecting the cells of each row in electrical parallel, each parallel interconnector comprising an electrically conductive strip on the rear side of said substrate and extending along the respective cell row under and electrically joined to the rear ends of the corresponding series interconnectors.

9. A solar array according to claim 8 wherein:

said series interconnectors provide the sole attachment of said cells to said substrate.

10. A solar array according to claim 9 wherein:

said substrate and interconnectors are flexible.

* * * * *